(12) United States Patent
Yoon et al.

(10) Patent No.: US 6,800,418 B2
(45) Date of Patent: Oct. 5, 2004

(54) FLUORINE-CONTAINING PHOTOSENSITIVE POLYMER HAVING HYDRATE STRUCTURE AND RESIST COMPOSITION COMPRISING THE SAME

(75) Inventors: Kwang-sub Yoon, Seoul (KR); Ki-yong Song, Seoul (KR); Sang-jun Choi, Seoul (KR); Sang-gyun Woo, Yongin (KR)

(73) Assignee: Samsung Electronics, Kyungki-do (KR)

( * ) Notice: Subject to any disclaimer, the term of this patent is extended or adjusted under 35 U.S.C. 154(b) by 182 days.

(21) Appl. No.: 10/264,429

(22) Filed: Oct. 4, 2002

(65) Prior Publication Data

US 2003/0157430 A1 Aug. 21, 2003

(30) Foreign Application Priority Data

Dec. 19, 2001 (KR) ........................................ 2001-81252

(51) Int. Cl.$^7$ ........................ G03F 7/004; C08F 214/18; C08F 12/02; C08F 220/68
(52) U.S. Cl. .................... 430/270.1; 430/907; 526/242; 526/247; 526/281; 526/320; 526/346; 526/334; 526/326
(58) Field of Search ............................... 430/270.1, 907; 526/242, 247, 281, 320, 346, 334, 326

(56) References Cited

U.S. PATENT DOCUMENTS

2003/0129527 A1 * 7/2003 Kudo et al. .............. 430/270.1
2004/0038151 A1 * 2/2004 Berger et al. ............ 430/271.1

* cited by examiner

Primary Examiner—Rosemary Ashton
(74) Attorney, Agent, or Firm—F. Chau & Associates

(57) ABSTRACT

Provided are a fluorine-containing photosensitive polymer having a hydrate structure and a resist composition including the photosensitive polymer. The photosensitive polymer has an average molecular weight of about 3,000–100,000 with a repeating unit including a group having one of structural formulae below:

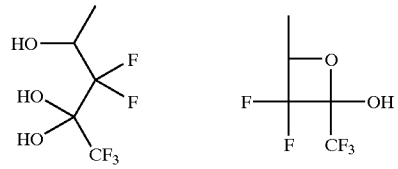

57 Claims, No Drawings

FLUORINE-CONTAINING PHOTOSENSITIVE POLYMER HAVING HYDRATE STRUCTURE AND RESIST COMPOSITION COMPRISING THE SAME

BACKGROUND OF THE INVENTION

1. Field of the Invention

The present invention relates to a photosensitive polymer and a chemically amplified resist composition, and more particularly, to a fluorine-containing photosensitive polymer and a resist composition including the photosensitive polymer.

2. Description of the Related Art

As the manufacture of semiconductor devices becomes complicated and the integration density of semiconductor devices increases, there is a need to form a fine pattern. Furthermore, with regard to semiconductor devices of 1-Gigabit or greater, a pattern size having a design rule of 0.1 μm or less is needed. However, when a conventional photoresist material is exposed with KrF excimer laser (248 nm), there is a limitation in forming such fine patterns. For this reason, a lithography technique using a new exposure light source, ArF excimer laser (193 nm), has emerged, and the focus of the research on ArF resist compositions has been on acrylic polymers and COMAs (cycloolefin-maleic anhydrides).

For a smaller pattern size, there is extensive focus on lithography using short-wavelength generating $F_2$ (157 nm) excimer laser. Conventional KrF or ArF resists are unsuitable for use with the short-wavelength source of 157 nm due to their low transmittance. Therefore, a polymer with a novel structure which is transparent to a157-nm wavelength is more suitable. A chemical component dissolvable in developer includes phenol, carboxylic acid, α-fluorocarbon-substituted alcohol, and hydroxy silane having a structure of formula 1 below:

[Formula 1]

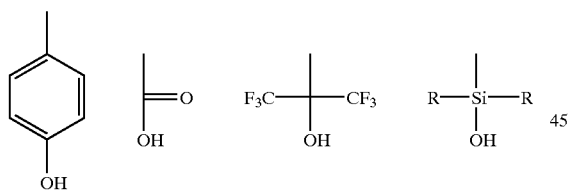

Among these components, phenol and carboxylic acid have a very poor transmittance with respect to 157-nm beam. Whereas α-fluorocarbon-substituted methanol and hydroxy silane are relatively more transparent at a wavelength of 157-nm. As a result, interest in studying α-fluorocarbon-substituted methanol and hydroxy silane has increased.

According to recent research data, appropriate substitution of a phenolic or carboxylic derivative with fluorine is found to be effective for transmittance and contrast enhancement, suggesting its use as a polymer for a 157-nm exposure source (*Journal of Photopolymer Science and Technology*, Vol. 14, No. 4, 583–593, 2001; *Journal of Photopolymer Science and Technology*, Vol. 14, No. 4, 669–674, 2001).

Structures of fluorine-substituted photosensitive polymers for conventional resist compositions are shown in formula 2 below.

[Formula 2]

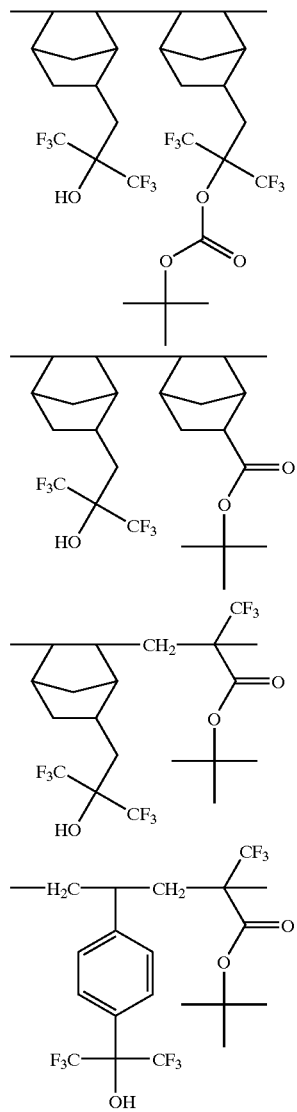

Despite the existence of the ether group in those structures of formula 2 above, advantages of a high transmittance due to the acrylate polymer and of their ease of preparation has increased use of those structures substituted with fluorocarbon to an appropriate degree. t-butyl trifluoromethyl acrylate is widely used as a monomer for enhancing contrast. An aromatic hydrocarbon monomer having a low transmittance at 157-nm can be changed into a hexafluoroisopropanol-substituted styrene structure with enhanced transmittance to be suitable as a resist material.

In addition, extensive research into resist compositions derived from acrylate polymers, non-carboxylic fluorinated vinyl ether polymers, and polymers with cyclic ether in their main chain, and copolymers of tetrafluoroethylene and norbornene derivatives known to be highly transparent at 157-nm, having structures of formula 3 below, are in progress.

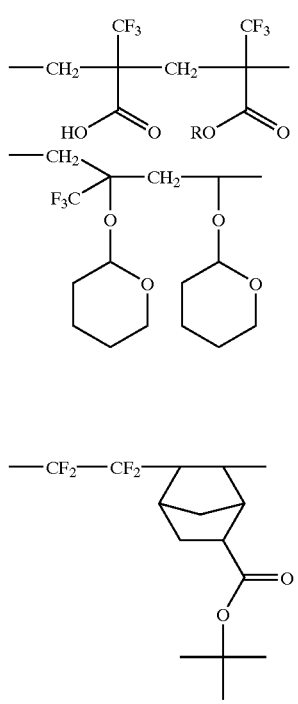

[Formula 3]

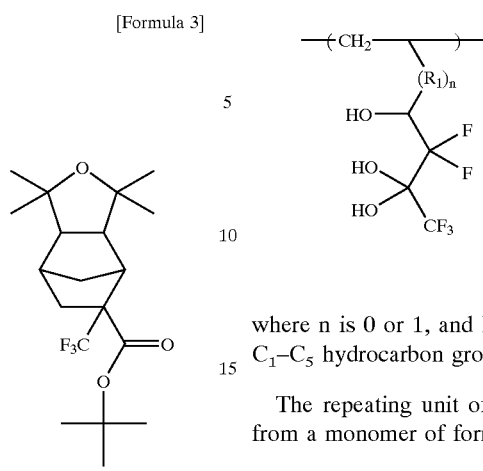

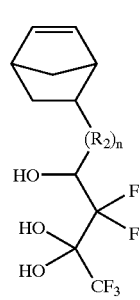

[Formula 5]

where n is 0 or 1, and $R_1$ is a substituted or unsubstituted $C_1$–$C_5$ hydrocarbon group.

The repeating unit of formula 5 above may be derived from a monomer of formula 6 below:

[Formula 6]

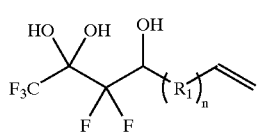

In formula 3 above, R may be a methyl group, a t-butyl group, an adamantly group, a trifluoromethylnorbornyl group, or a hexafluoroisopropyl group.

A fluorinated polymer has excellent transmittance at 157-nm when it contains more fluorine atoms, but its enhanced hydrophobicity degrades adhesion to an underlayer. To date, resist materials having a suitable structure for 157-nm laser have not been found. Therefore, there is a need for a polymer having a high transmittance at 157-nm and without the aforementioned problems and thus be suitable as a resist material for $F_2$ excimer laser.

SUMMARY OF THE INVENTION

It is an object of the present invention to provide a photosensitive polymer having a structure to give a high transmittance at a $F_2$ excimer laser wavelength of 157 nm and good adhesion to an underlayer.

It is another object of the present invention to provide a resist composition allowing development with conventional developers and having a high transmittance at a $F_2$ excimer laser wavelength of 157 nm, good hydrophilicity, and good adhesion to an underlayer.

According to an aspect of the present invention, a photosensitive polymer is provided having an average molecular weight of about 3,000–100,000 with a repeating unit including a group of one of the structures of formula 4 below:

[Formula 4]

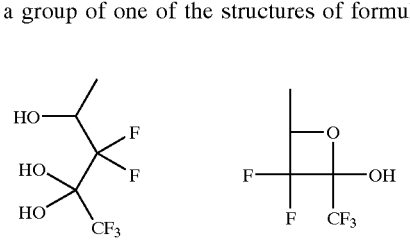

In the photosensitive polymer, the repeating unit may have a structure of formula 5 below:

Alternatively, the repeating unit constituting the photosensitive polymer according to an embodiment of the present invention may have a structure of formula 7 below:

[Formula 7]

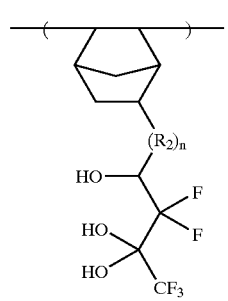

where n is 0 or 1, and $R_2$ is a substituted or unsubstituted $C_1$–$C_5$ hydrocarbon group.

The repeating unit of formula 7 above may be derived from a monomer of formula 8 below:

[Formula 8]

Alternatively, the repeating unit constituting the photosensitive polymer according to an embodiment of the present invention may have a structure of formula 9 below:

[Formula 9]

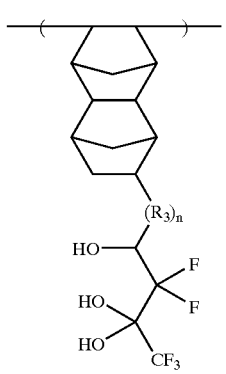

where n is 0 or 1, and $R_3$ is a substituted or unsubstituted $C_1$–$C_5$ hydrocarbon group.

The repeating unit of formula 9 above may be derived from a monomer of formula 10 below:

[Formula 10]

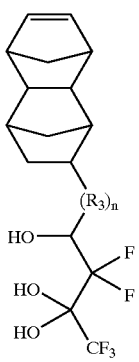

Alternatively, the repeating unit constituting the photosensitive polymer according to an embodiment of the present invention may have a structure of formula 11 below:

[Formula 11]

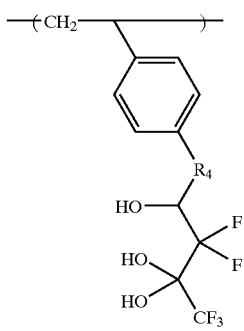

where $R_4$ is a substituted or unsubstituted $C_1$–$C_5$ hydrocarbon group.

The repeating unit of formula 11 above may be derived from a monomer of formula 12 below:

[Formula 12]

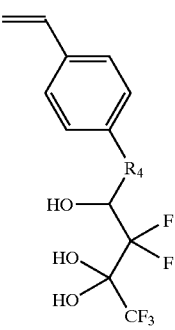

Alternatively, the repeating unit constituting the photosensitive polymer according to an embodiment of the present invention may have a structure of formula 13 below:

[Formula 13]

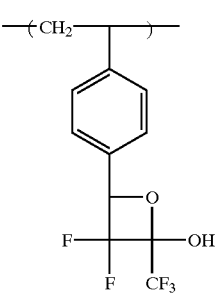

The repeating unit of formula 13 above may be derived from a monomer of formula 14 below:

[Formula 14]

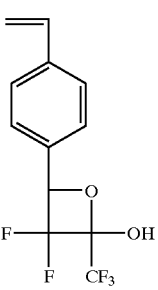

According to a second embodiment of the present invention, a photosensitive polymer is provided having an average molecular weight of about 3,000–100,000 with a first repeating unit having one group of a structure selected from formula 4 above and at least one second repeating unit selected from the group consisting of acrylate, methacrylate, maleic anhydride, norbornene, styrene, tetrafluoroethylene, and sulfur dioxide derivatives.

Alternatively, the photosensitive polymer according to the second embodiment of the present invention may have a structure of formula 15 below:

[Formula 15]

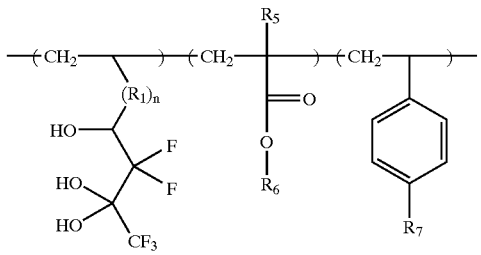

where n is 0 or 1; $R_1$ is a substituted or unsubstituted $C_1$–$C_5$ a hydrocarbon group; $R_5$ is hydrogen atom, a methyl group, or a trifluoromethyl group; $R_6$ is a hydrogen atom or a substituted or unsubstituted $C_1$–$C_{20}$ hydrocarbon group; and $R_7$ is hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, $R_6$ is a $C_4$–$C_{12}$ acid-labile group, and more preferably, a t-butyl group. Preferably, $R_7$ is a fluorinated $C_3$–$C_{12}$ alkyl alcohol group or an acid-labile $C_4$–$C_{12}$ ester group. For example, $R_7$ may be a 2-hydroxyhexafluoroisopropyl group, a t-butoxycarbonyloxyhexafluoroisopropyl group, or a 2-hydroxytrifluoroisopropyl group.

Alternatively, the photosensitive polymer according to the second embodiment of the present invention may have a structure of formula 16 below:

[Formula 16]

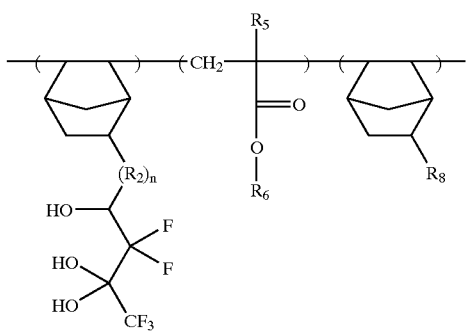

where n is 0 or 1; $R_2$ is a substituted or unsubstituted $C_1$–$C_5$ hydrocarbon group; $R_5$ a is hydrogen atom, a methyl group, or a trifluoromethyl group; $R_6$ is a hydrogen atom or a substituted or unsubstituted $C_1$–$C_{20}$ hydrocarbon group; and $R_8$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, $R_6$ is a $C_4$–$C_{12}$ acid-labile group, and more preferably, a t-butyl group. Preferably, $R_8$ is a fluorinated $C_3$–$C_{10}$ alkyl alcohol group. For example, $R_8$ may be a 2-hydroxyhexafluoroisopropyl group.

Alternatively, the photosensitive polymer according to the second embodiment of the present invention may have a structure of formula 17 below:

[Formula 17]

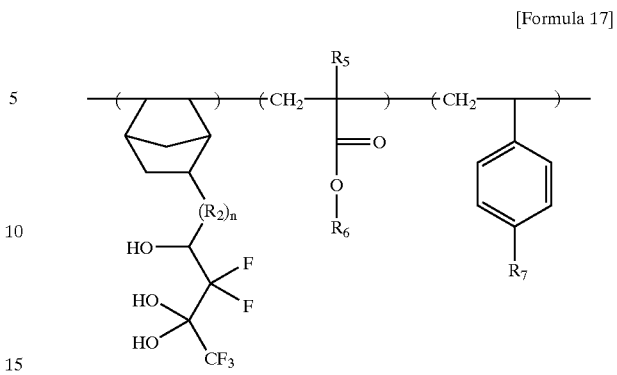

where n is 0 or 1; $R_2$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, $R_6$ is a $C_4$–$C_{12}$ acid-labile group, and more preferably, a t-butyl group. Preferably, $R_7$ is a fluorinated $C_3$–$C_{10}$ alkyl alcohol group or an acid-labile $C_4$–$C_{12}$ ester group. For example, $R_7$ may be a 2-hydroxyhexafluoroisopropyl group, a t-butoxycarbonyloxyhexafluoroisopropyl group, or a 2-hydroxytrifluoroisopropyl group.

Alternatively, the photosensitive polymer according to the second embodiment of the present invention may have a structure of formula 18 below:

[Formula 18]

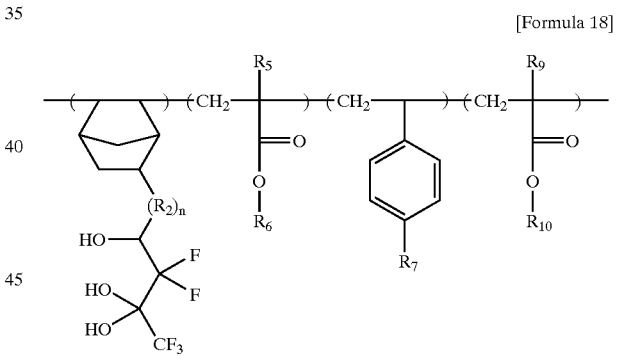

where n is 0 or 1; $R_2$ is a substituted or unsubstituted $C_1$–$C_5$ hydrocarbon group; $R_5$ and $R_9$, independent of one another, may be a hydrogen atom, a methyl group, or a trifluoromethyl group; $R_6$ and $R_{10}$, independent of one another, may be a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, either $R_6$ or $R_{10}$ is a $C_4$–$C_{12}$ acid-labile group, and more preferably, a t-butyl group. Preferably, $R_7$ is a fluorinated $C_3$–$C_{10}$ alkyl alcohol group or an acid-labile $C_4$–$C_{12}$ ester group. For example, $R_7$ may be a 2-hydroxyhexafluoroisopropyl group, a t-butoxycarbonyloxyhexafluoroisopropyl group, or a 2-hydroxytrifluoroisopropyl group.

Alternatively, the photosensitive polymer according to the second embodiment of the present invention may have a structure of formula 19 below:

[Formula 19]

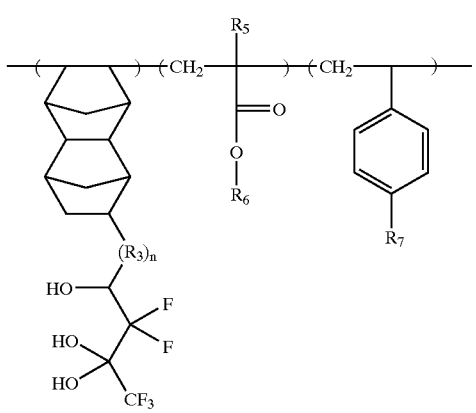

where n is 0 or 1; $R_3$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, $R_6$ is a $C_4$–$C_{12}$ acid-labile group, and more preferably, a t-butyl group. Preferably, $R_7$ is a fluorinated $C_3$–$C_{10}$ alkyl alcohol group or an acid-labile $C_4$–$C_{12}$ ester group. For example, $R_7$ may be a 2-hydroxyhexafluoroisopropyl group, a t-butoxycarbonyloxyhexafluoroisopropyl group, or a 2-hydroxytrifluoroisopropyl group.

Alternatively, the photosensitive polymer according to the second embodiment of the present invention may have a structure of formula 20 below:

[Formula 20]

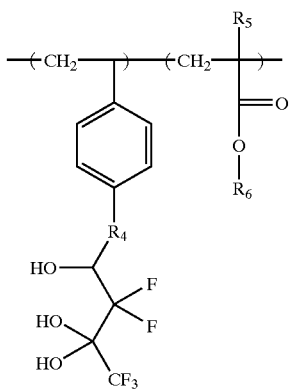

where $R_4$ is a substituted or unsubstituted $C_1$–$C_5$ hydrocarbon group; $R_5$ is a hydrogen atom, a methyl group, or a trifluoromethyl group; and $R_6$ is a hydrogen atom or a substituted or unsubstituted $C_1$–$C_{20}$ hydrocarbon group. Preferably, $R_6$ is a $C_4$–$C_{12}$ acid-labile group, and more preferably, a t-butyl group.

Alternatively, the photosensitive polymer according to the second embodiment of the present invention may have a structure of formula 21 below:

[Formula 21]

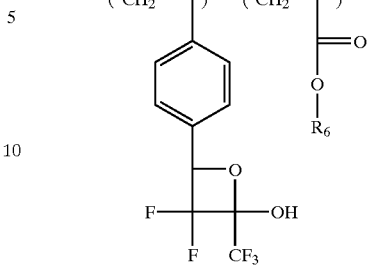

where $R_5$ is a hydrogen atom, a methyl group, or a trifluoromethyl group; and $R_6$ is a hydrogen atom or a substituted or unsubstituted $C_1$–$C_{20}$ hydrocarbon group. Preferably, $R_6$ is a $C_4$–$C_{12}$ acid-labile group, and more preferably, a t-butyl group.

Alternatively, the photosensitive polymer according to the second embodiment of the present invention may have a structure of formula 22 below:

[Formula 22]

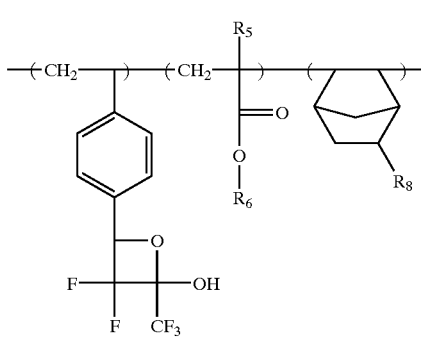

where $R_5$ is a hydrogen atom, a methyl group, or a trifluoromethyl group; $R_6$ is a hydrogen atom or a substituted or unsubstituted $C_1$–$C_{20}$ hydrocarbon group; and $R_8$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group. Preferably, $R_6$ is a $C_4$–$C_{12}$ acid-labile group, and more preferably, a t-butyl group. Preferably, $R_8$ is a fluorinated $C_3$–$C_{10}$ alkyl alcohol group. For example, $R_8$ may be a 2-hydroxyhexafluoroisopropyl group.

According to another aspect of the present invention, there is provided a resist composition comprising the photosensitive polymer having one structure of the formulae above and a photoacid generator (PAG).

Preferably, the photoacid generator is contained in an amount of about 1–15% by weight based on the total weight of the photosensitive polymer. Preferably, the photoacid generator comprises triarylsulfonium salts, diaryliodonium salts, sulfonates, or a mixture of these compounds. Suitable examples of the photoacid generator include triphenylsulfonium triflate, triphenylsulfonium antimonate, diphenyliodonium triflate, diphenyliodonium antimonite, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium perfluorooctanesulfonate, methoxydiphenyliodonium perfluorooctanesulfonate, di-t-butyldiphenyliodonium triflate, N-hydroxysuccinimide perfluorooctanesulfonate, norbornene-dicarboximide perfluorooctanesulfonate, or a mixture of these compounds.

It is preferable that the resist composition according to an embodiment of the present invention further comprises an organic base. In this case, the organic base may be contained in an amount of about 0.01–2.0% by weight based on the total weight of the photosensitive polymer. Preferably, the organic base comprises a single tertiary amine compound or a mixture of at least two ternary amine compounds. For example, the organic base may be triethylamine, triisobutylamine, triisooctylamine, triisodecylamine, diethanolamine, triethanolamine, or a mixture of these compounds.

It is preferable that the resist composition according to an embodiment of the present invention further comprises a surfactant of about 30–200 ppm.

It is preferable that the resist composition according to an embodiment of the present invention further comprises a dissolution inhibitor of about 0.1–50% by weight based on the total weight of the photosensitive polymer.

A photosensitive polymer according to an embodiment of the present invention contains relatively more fluorine atoms and has a hydrate structure with a number of hydrophilic groups, for example, hydroxyl groups. Thus, a resist composition derived from the polysensitive polymer according to the present invention provides good adhesion to an underlayer and high transmittance at a $F_2$ excimer laser wavelength of 157 nm. The photosensitive polymer according to an embodiment of the present invention has an appropriate glass transition temperature in the range of about 120–180° C., and the resist composition according to the present invention derived from the photosensitive polymer allows development using conventional developers. Therefore, the resist composition according to the present invention shows excellent lithography performance when applied to a photolithography process using a $F_2$ excimer laser of 157 nm, and thus is expected to be useful in the manufacture of next generation semiconductor devices.

DETAILED DESCRIPTION OF [THE INVENTION] PREFERRED EMBODIMENTS

SYNTHESIS EXAMPLE 1

Synthesis of Monomer

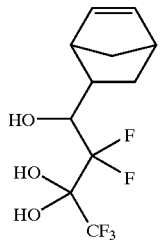

70 g hexafluoroisopropyl alcohol was dissolved in 350 mL dry tetrahydrofuran (THF), followed by dropwise addition of 350 mL 2.5M n-butyllithium for 30 minutes at −70° C. in a nitrogen atmosphere. After stirring for 10 minutes at −70° C., the temperature was elevated in a 0° C.-ice bath. After stirring for additional 1 hour, 53 g of 5-norbornene-2-carboxaldehyde was dropwise added into the solution and stirred at 0° C. for 2 hours. After neutralization with 450 mL a 1 M aqueous solution of hydrochloric acid, the organic phase was separated. The organic layer was diluted with 500 mL of ethylacetate and washed with 500 mL of a saturated aqueous solution of NaCl. The aqueous phase was extracted with 500 mL of ethylacetate. After drying the isolated organic phase with anhydrous $MgSO_4$, the ethylacetate was distilled under reduced pressure. The remaining product was subjected to column chromatography by using a 1:3 mixture of ethylacetate and hexane by volume as a solvent. Recrystallization at a low temperature following solvent removal resulted 1-bicyclo[2.2.1]hept-5-ene-2-yl-2,2,4,4,4-pentafluoro-butan-1,3,3-triol with a yield of 51%.

SYNTHESIS EXAMPLE 2

Synthesis of Monomer

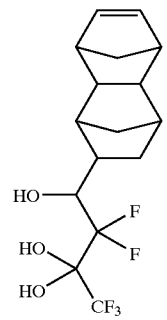

The procedures of Synthesis Example 1 were followed except that 8-aldehydotetracyclo[4.4.0.1$^{2.5^1}$.1$^{7.10}$]dodec-3-ene was used instead of 5-norbornene-2-carboxaldehyde, to synthesize tetracyclo[4.4.0.1$^{2.5}$.1$^{7.10}$]dodec-3-enyl-2,2,4,4,4-pentafluoro-butan-1,3,3-triol with a yield of 58%.

SYNTHESIS EXAMPLE 3

Synthesis of Monomer

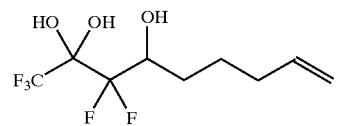

The procedures of Synthesis Example 1 were followed except that pent-4-enal was used instead of 5-norbornene-2-carboxaldehyde, to synthesize 1,1,1,3,3-pentafluoro-non-8-ene-2,2,4-triol with a yield of 78%.

SYNTHESIS EXAMPLE 4

Synthesis of Monomer

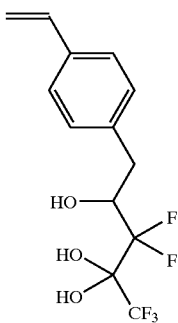

The procedures of Synthesis Example 1 were followed except that (4-vinyl-phenyl)-acetaldehyde was used instead of 5-norbornene-2-carboxaldehyde, to synthesize 1,1,1,3,3-pentafluoro-5-(4-vinyl-phenyl)-pentane-2,2,4-triol with a yield of 75%.

SYNTHESIS EXAMPLE 5

Synthesis of Monomer

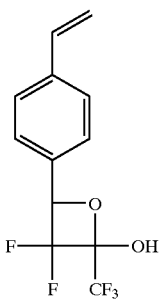

The procedures of Synthesis Example 1 were followed except that 4-vinylbenzaldehyde was used instead of 5-norbornene-2-carboxaldehyde, to synthesize 2-trifluoromethyl-2-hydroxy-3,3-difluoro-4-phenyloxyethane with a yield of 71%.

Example 1

Synthesis of Polymer

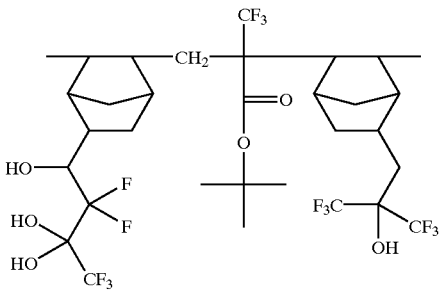

2.9 g 1-bicyclo[2.2.1]hept-5-ene-2-yl-2,2,4,4,4,-pentafluoro-butane-1,3,3,-triol, 4 g 2-trifluoromethyl-acrylic acid t-butyl ester, 2.8 g 2-bicyclo[2.2.1]hept-5-ene-2-ylmethyl-1,1,1,3,3,3-hexafluoro-propan-2-ol, 0.34 g 1,6-hexandiol divinylether, and 0.6 g azobisisobutyronitrile (AIBN) were reacted at 65° C. for 24 hours. The resultant reaction product was precipitated twice in excess hexane and filtered. The filtrate was dried in a vacuum oven for 24 hours to recover a polymer having a desired structure with a yield of 58%.

The resultant polymer had an average molecular weight (Mw) of 15,400 and a polydispersity (Mw/Mn) of 13.4.

Example 2

Synthesis of Polymer

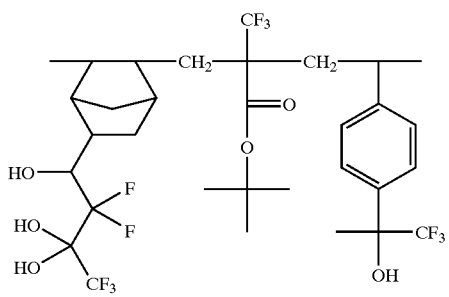

2.1 g 1-bicyclo[2.2.1]hept-5-ene-2-yl-2,2,4,4,4,-pentafluoro-butan-1,3,3,-triol, 3 g 2-trifluoromethyl-acrylic acid t-butyl ester, 1.5 g 1,1,1-trifluoro-2-(4-vinyl-phenyl)-propan-2-ol, 0.42 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 72%.

The resultant polymer had an average molecular weight (Mw) of 22,000 and a polydispersity (Mw/Mn) of 1.5.

Example 3

Synthesis of Polymer

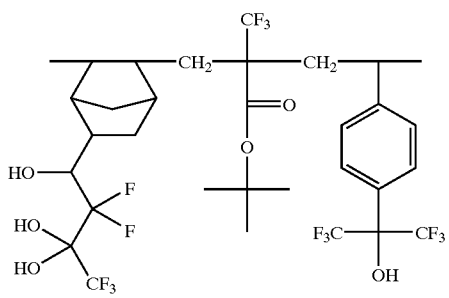

2.7 g 1-bicyclo[2.2.1]hept-5-ene-2-yl-2,2,4,4,4,-pentafluoro-butan-1,3,3,-triol, 1.8 g 2-trifluoromethyl-acrylic acid t-butyl ester, 2.5 g 1,1,1,3,3,3-hexafluoro-2-(4-vinyl-phenyl)-propan-2-ol, and 0.24 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 71%.

The resultant polymer had an average molecular weight (Mw) of 29,000 and a polydispersity (Mw/Mn) of 1.7.

Example 4

Synthesis of Polymer

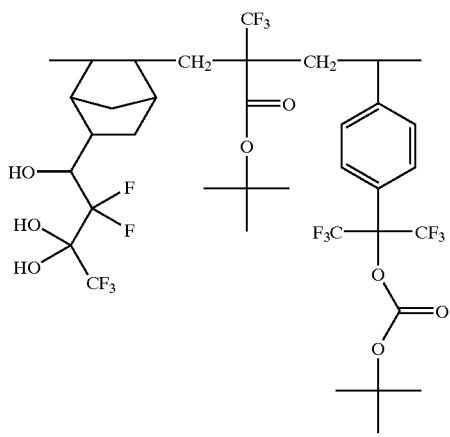

2.1 g 1-bicyclo[2.2.1]hept-5-ene-2-yl-2,2,4,4,4,-pentafluoro-butan-1,3,3,-triol, 3 g 2-trifluoromethyl-acrylic acid t-butyl ester, 2.4 g carbonic acid t-butyl ester 2,2,2-trifluoro-1-trifluoromethyl-1-(4-vinyl-phenyl)-ethyl ester, and 0.42 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 66%.

The resultant polymer had an average molecular weight (Mw) of 28,000 and a polydispersity (Mw/Mn) of 1.7.

Example 5

Synthesis of Polymer

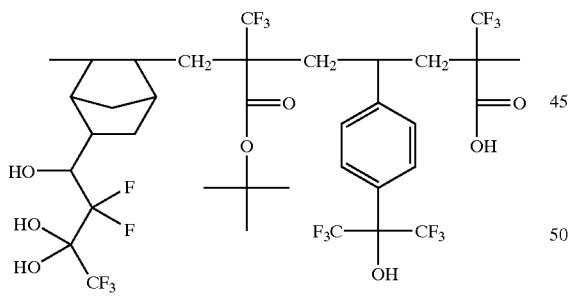

3.5 g 1-bicyclo[2.2.1]hept-5-ene-2-yl-2,2,4,4,4,-pentafluoro-butan-1,3,3,-triol, 2.4 g 2-trifluoromethyl-acrylic acid t-butyl ester, 3.2 g carbonic acid t-butyl ester 2,2,2-trifluoro-1-trifluoromethyl-1-(4-vinyl-phenyl)-ethyl ester, 0.15 g trifluoromethacrylic acid, and 0.48 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 65%.

The resultant polymer had an average molecular weight (Mw) of 26,900 and a polydispersity (Mw/Mn) of 2.52.

Example 6

Synthesis of Polymer

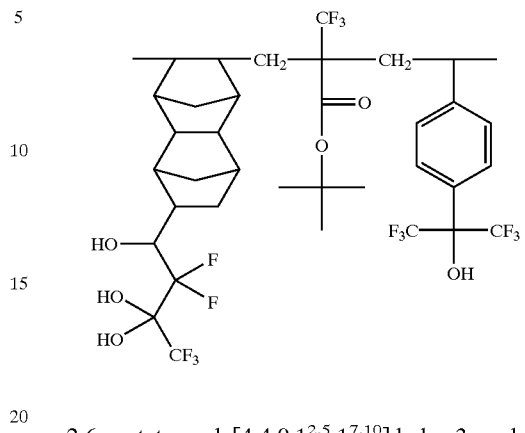

2.6 g tetracyclo[4.4.0.1$^{2.5}$.1$^{7.10}$]dodec-3-enyl-2,2,4,4,4-pentafluoro-butan-1,3,3-triol, 3 g 2-trifluoromethyl-acrylic acid t-butyl ester, 2 g 1,1,1,3,3,3-hexafluoro-2-(4-vinyl-phenyl)-propan-2-ol, and 0.42 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 61%.

The resultant polymer had an average molecular weight (Mw) of 27,000 and a polydispersity (Mw/Mn) of 1.8.

Example 7

Synthesis of Polymer

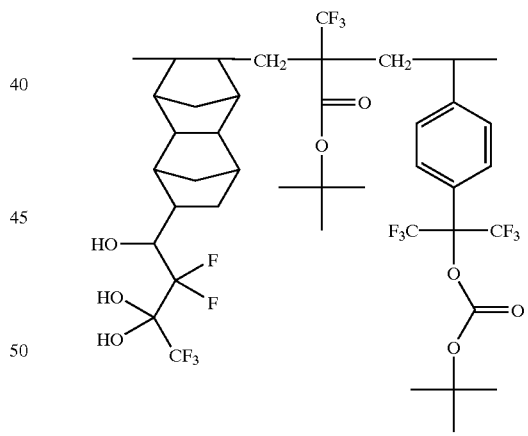

2.6 g tetracyclo[4.4.0.1$^{2.5}$.1$^{7.10}$]dodec-3-enyl-2,2,4,4,4-tentafluoro-butan-1,3,3-triol, 3 g 2-trifluoromethyl-acrylic acid t-butyl ester, 2.4 g carbonic acid t-butyl ester 2,2,2-trifluoro-1-trifluoromethyl-1-(4-vinyl-phenyl)-ethyl ester, and 0.42 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 56%.

The resultant polymer had an average molecular weight (Mw) of 24,000 and a polydispersity (Mw/Mn) of 1.9.

Example 8

Synthesis of Polymer

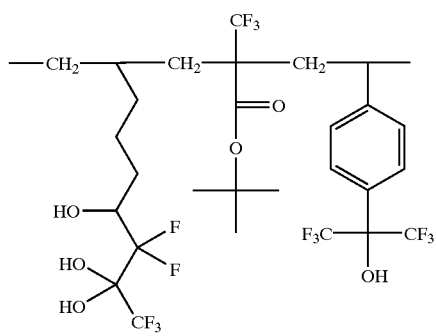

3.9 g 1,1,1,3,3,-pentafluoro-non-8-ene-2,2,4-triol, 3 g 2-trifluoromethyl-acrylic acid t-butyl ester, 4.0 g 1,1,1-trifluoro-2-(4-vinyl-phenyl)-propan-2-ol, and 0.36 g AIBN were degassed and reacted at 65° C. for 24 hours. The resultant reaction product was precipitated twice in excess hexane and filtered. The filtrate was dried in a vacuum oven for 24 hours to recover a polymer having a desired structure with a yield of 58%.

The resultant polymer had an average molecular weight (Mw) of 27,000 and a polydispersity (Mw/Mn) of 2.1.

Example 9

Synthesis of Polymer

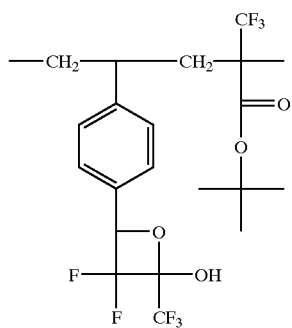

2.8 g 2-trifluoromethyl-2-hydroxy-3,3-difluoro 4-phenyloxyethane, 2 g 2-trifluoromethyl-acrylic acid t-butyl ester, and 0.16 g AIBN were dissolved in 5 g ethylacetate, degassed, and polymerized at 65° C. for 24 hours.

The resultant polymer had an average molecular weight (Mw) of 25,200 and a polydispersity (Mw/Mn) of 2.6.

Example 10

Synthesis of Polymer

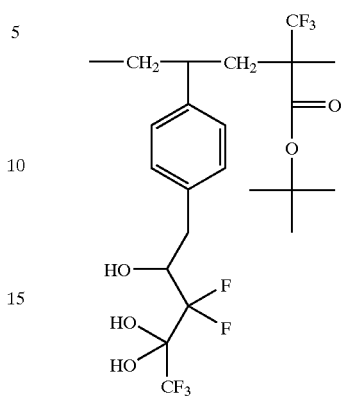

4.6 g 1,1,1,3,3-pentafluoro-5-(4-vinyl-phenyl)-pentane-2,2,4-triol, 3 g 2-trifluoromethyl-acrylic t-butyl ester, and 0.24 g AIBN were dissolved in 5 g ethylacetate, degassed, and polymerized at 65° C. for 24 hours. The resultant reaction product was precipitated twice in excess hexane and filtered. The filtrate was dried in a vacuum oven for 24 hours to recover a polymer having a desired structure with a yield of 71%.

The resultant polymer had an average molecular weight (Mw) of 28,000 and a polydispersity (Mw/Mn) of 2.4.

Example 11

Synthesis of Polymer

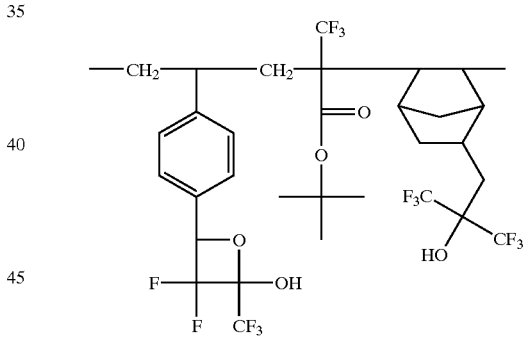

2.8 g 2-trifluoromethyl-2-hydroxy-3,3-difluoro 4-phenyloxyethane, 2 g 2-trifluoromethyl-acrylic acid t-butyl ester, 1.3 g 2-bicyclo[2.2.1]hept-5-ene-2-ylmethyl-1,1,1,3,3,3-hexafluoro-propan-2-ol, and 0.24 g AIBN were dissolved in 3 g ethylacetate, degassed, and polymerized at 65° C. for 24 hours.

The resultant polymer had an average molecular weight (Mw) of 26,400 and a polydispersity (Mw/Mn) of 2.3.

Example 12

Preparation of Resist Composition 1.0 g of each of the polymers synthesized in Examples 1 through 11 was dissolved in 15 g cyclohexanon together with 0.05 g triphenylsulfonium trifluoromethanesulfonate (triflate) as a photoacid generator (PAG) and 5 mg triisodecylamine as an organic base. Each mixed solution was filtered through a 0.2-μm-membrane filter to obtain a resist composition. Each of the resist compositions was coated on a silicon wafer having an organic anti-reflective coating (ARC) to a thickness of about 0.15 μm.

Each of the wafers coated with different resist compositions was soft-baked at a temperature of 100–140° C. for 60 seconds and exposed using an $F_2$ excimer laser stepper (NA=0.6). After the exposure process, the wafer was subjected to post-exposure bake (PEB) at a temperature of 110–140° C. for 60 seconds. The resultant wafer was subjected to development with a 2.38% by weight tetramethylammonium hydroxide (TMAH) solution, to form a resist pattern.

As a result, a pattern of lines and spaces of 0.08–0.23 μm was obtained at an exposure dose of about 5–60 mJ/cm².

Evaluation Example

Measurement of pKa Value

To determine whether a repeating monomer unit of a polymer according to the present invention has a structure dissolvable in common developers, pKa value was measured.

The pKa value was measured for a variety of monomers having different structures to identify whether hydrate is dissolvable in developers. The results are shown in Table 1.

adhesion to an underlayer. Since the photosensitive polymer according to an embodiment of the present invention contains a number of fluorine atoms, its transmittance with respect to an $F_2$ excimer laser having a short wavelength (e.g., 157 nm) is great. Therefore, when a resist layer formed of the resist composition according to the present invention is patterned into a pattern of lines, the resulting pattern shows little lines with rough edges.

The photosensitive polymer according to the present invention has an appropriate glass transition temperature of about 120–180° C. A resist layer formed of a resist composition containing the photosensitive polymer according to the present invention is sufficiently annealed during a baking process, thereby resulting a reduced free volume in the resist layer. Accordingly, stability of the resist layer against environmental conditions is improved even when post-exposure delay occurs. The resist composition according to the present invention is applicable with general developers. The resist composition according to the present invention shows excellent lithography performance when applied to a lithography process using an $F_2$ excimer laser of 157 nm, with the expectation of effectiveness in the manufacture of next generation semiconductor devices.

TABLE 1

| MONOMER 1 | MONOMER 2 | MONOMER 3 | MONOMER 4 | MONOMER 5 | MONOMER 6 |
|---|---|---|---|---|---|
| (structure) | (structure) | (structure) | (structure) | (structure) | (structure) |
| pKa = 15.24 | pKa = 9.97 | pKa = 4.58 | pKa = 9.67 | pKa = 8.96 | pKa = 8.33 |

As shown in Table 1, vinylphenol (monomer 2 of Table 1) for KrF resist compositions has a pKa value of 9.97, a methylmethacarboxylic acid structure (monomer 3 of Table 1) for ArF resist compositions has a pKa value of 4.58. Hexafluoroisopropanols (monomers 4 and 5 of Table 1) have a pKa of 9.67 and 8.96, respectively, which are slightly different due to their substitute groups but are similar to that from phenol. Those levels of acidity of monomers 4 and 5 are due to a trifluoromethyl group at the α-carbon position of the hydroxyl (—OH) group acting as a strong electron withdrawer for taking H⁺ ions from the hydroxyl group.

A monomer (monomer 6 of Table 1) forming a repeating unit of a polymer according to the present invention has a relatively low pKa value of 8.33. From this result, the polymer according to the present invention is expected to more easily react with an alkaline developer.

A photosensitive polymer according to an embodiment of the present invention contains more fluorine atoms and has a hydrate structure with a number of hydrophilic groups, such as a hydroxyl group. A photosensitive polymer according to an embodiment of the present invention with three hydroxyl groups can enhance hydrophilicity of a resist composition prepared therefrom. Therefore, the resist composition prepared with the photosensitive polymer according to an embodiment of the present invention exhibits good While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photosensitive polymer having an average molecular weight of about 3,000–100,000 with a repeating unit including a group of one of the following structural formulae:

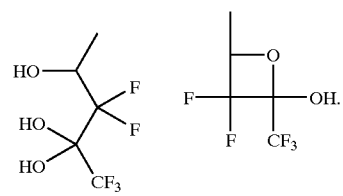

2. The photosensitive polymer of claim 1, wherein the repeating unit has a structural formula:

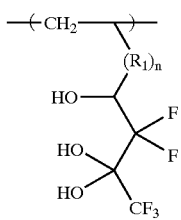

where n is 0 or 1, and $R_1$ is a substituted or unsubstituted $C_1$–$C_5$ hydrocarbon group.

3. The photosensitive polymer of claim 1, wherein the repeating unit has a structural formula:

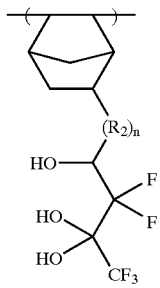

where n is 0 or 1, and $R_2$ is a substituted or unsubstituted $C_1$–$C_5$ hydrocarbon group.

4. The photosensitive polymer of claim 1, wherein the repeating unit has a structural formula:

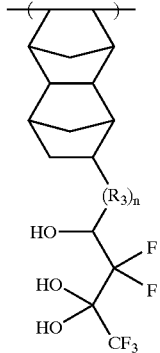

where n is 0 or 1, and $R_3$ is a substituted or unsubstituted $C_1$–$C_5$ hydrocarbon group.

5. The photosensitive polymer of claim 1, wherein the repeating unit has a structural formula:

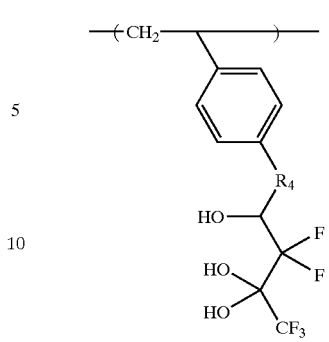

where $R_4$ is a substituted or unsubstituted $C_1$–$C_5$ hydrocarbon group.

6. The photosensitive polymer of claim 1, wherein the repeating unit has a structural formula:

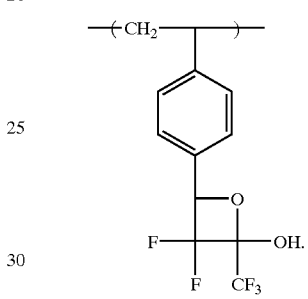

7. A photosensitive polymer having an average molecular weight of about 3,000–100,000 with a first repeating unit selected from the group of one of the following structural formulae:

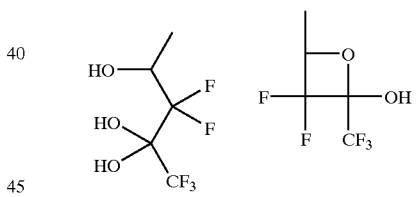

and at least one second repeating unit [(b)] selected from the group consisting of acrylate, methacrylate, maleic anhydride, norbornene, styrene, tetrafluoroethylene, and sulfur dioxide derivatives.

8. The photosensitive polymer of claim 7 having a structural formula:

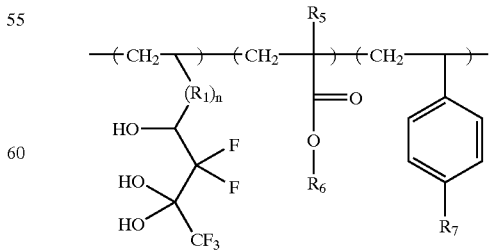

where n is 0 or 1; $R_1$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

9. The photosensitive polymer of claim 8, wherein $R_6$ is a $C_4$–$C_{12}$ acid-labile group.

10. The photosensitive polymer of claim 9, wherein $R_6$ is a t-butyl group.

11. The photosensitive polymer of claim 8, wherein $R_7$ is a fluorinated $C_3$–$C_{12}$ alkyl alcohol group.

12. The photosensitive polymer of claim 8, wherein $R_7$ is an acid labile $C_4$–$C_{12}$ ester group.

13. The photosensitive polymer of claim 8, wherein $R_7$ is a 2-hydroxyhexafluoroisopropyl group, a t-butoxycarbonyloxyhexafluoroisopropyl group, or a 2-hydroxytrifluoroisopropyl group.

14. The photosensitive polymer of claim 7 having a structural formula:

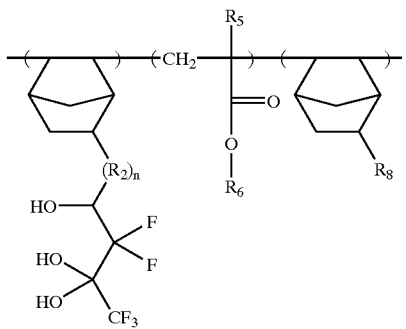

where n is 0 or 1; $R_2$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_8$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

15. The photosensitive polymer of claim 14, wherein $R_6$ is a $C_4$–$C_{12}$ acid-labile group.

16. The photosensitive polymer of claim 15, wherein $R_6$ is a t-butyl group.

17. The photosensitive polymer of claim 14, wherein $R_8$ is a fluorinated $C_3$–$C_{10}$ alkyl alcohol group.

18. The photosensitive polymer of claim 14, wherein $R_8$ is a 2-hydroxyhexafluoroisopropyl group.

19. The photosensitive polymer of claim 7 having a structural formula:

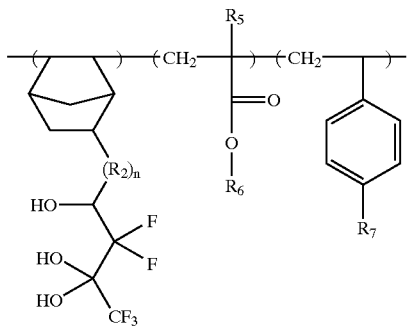

where n is 0 or 1; $R_2$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

20. The photosensitive polymer of claim 19, wherein $R_6$ is a $C_4$–$C_{12}$ acid-labile group.

21. The photosensitive polymer of claim 20, wherein $R_6$ is a t-butyl group.

22. The photosensitive polymer of claim 19, wherein $R_7$ is a fluorinated $C_3$–$C_{10}$ alkyl alcohol group.

23. The photosensitive polymer of claim 19, wherein $R_7$ is an acid-labile $C_4$–$C_{12}$ ester group.

24. The photosensitive polymer of claim 19, wherein $R_7$ is a 2-hydroxyhexafluoroisopropyl group, a t-butoxycarbonyloxyhexafluoroisopropyl group, or a 2-hydroxytrifluoroisopropyl group.

25. The photosensitive polymer of claim 7 having a structural formula:

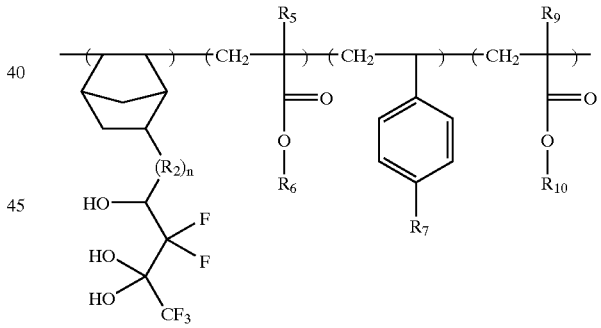

where n is 0 or 1; $R_2$ is a substituted or unsubstituted $C_1$–$C_5$ hydrocarbon group; $R_5$ and $R_9$, independent of one another, may be a hydrogen atom, a methyl group, or a trifluoromethyl group; $R_6$ and $R_{10}$, independent of one another, may be a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

26. The photosensitive polymer of claim 25, wherein at least one of $R_6$ and $R_{10}$ is a $C_4$–$C_{12}$ acid-labile group.

27. The photosensitive polymer of claim 26, wherein at least one of $R_6$ and $R_{10}$ is a t-butyl group.

28. The photosensitive polymer of claim 25, wherein $R_7$ is a fluorinated $C_3$–$C_{10}$ alkyl alcohol group.

29. The photosensitive polymer of claim 25, wherein $R_7$ is an acid-labile $C_4$–$C_{12}$ ester group.

30. The photosensitive polymer of claim 25, wherein $R_7$ is a 2-hydroxyhexafluoroisopropyl group, a t-butoxycarbonyloxyhexafluoroisopropyl group, or a 2-hydroxytrifluoroisopropyl group.

31. The photosensitive polymer of claim 7 having a structural formula:

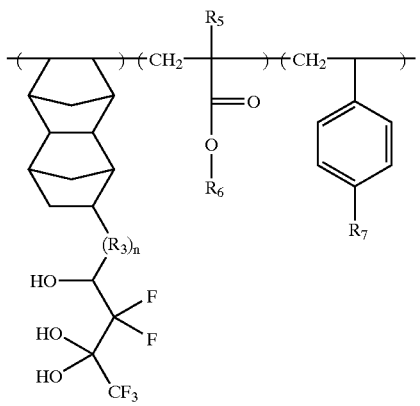

where n is 0 or 1; $R_3$ is a substituted or unsubstituted $C_1$–$C_5$ hydrocarbon group; $R_5$ is a hydrogen atom, a methyl group, or a trifluoromethyl group; $R_6$ is a hydrogen atom or a substituted or unsubstituted $C_1$–$C_{20}$ hydrocarbon group; and $R_7$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

32. The photosensitive polymer of claim 31, wherein $R_6$ is a $C_4$–$C_{12}$ acid labile group.

33. The photosensitive polymer of claim 32, wherein $R_6$ is a t-butyl group.

34. The photosensitive polymer of claim 31, wherein $R_7$ is a fluorinated $C_3$–$C_{10}$ alkyl alcohol group.

35. The photosensitive polymer of claim 31, wherein $R_7$ is an acid-labile $C_4$–$C_{12}$ ester group.

36. The photosensitive polymer of claim 31, wherein $R_7$ is a 2-hydroxyhexafluoroisopropyl group, a t-butoxycarbonyloxyhexafluoroisopropyl group, or a 2-hydroxytrifluoroisopropyl group.

37. The photosensitive polymer of claim 7 having a structural formula:

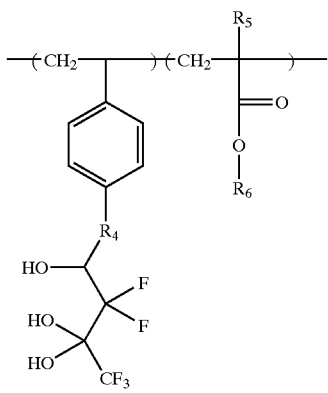

where $R_4$ is a substituted or unsubstituted $C_1$–$C_5$ hydrocarbon group; $R_5$ is a hydrogen atom, a methyl group, or a trifluoromethyl group; and $R_6$ is a hydrogen atom or a substituted or unsubstituted $C_1$–$C_{20}$ hydrocarbon group.

38. The photosensitive polymer of claim 37, wherein $R_6$ is a $C_4$–$C_{12}$ acid-labile group.

39. The photosensitive polymer of claim 38, wherein $R_6$ is a t-butyl group.

40. The photosensitive polymer of claim 7 having a structural formula:

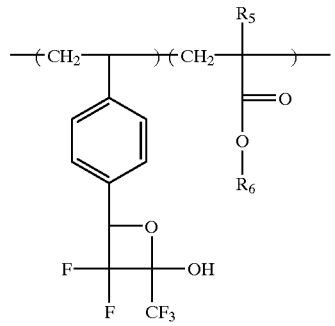

where $R_5$ is a hydrogen atom, a methyl group, or a trifluoromethyl group; and $R_6$ is a hydrogen atom or a substituted or unsubstituted $C_1$–$C_{20}$ hydrocarbon group.

41. The photosensitive polymer of claim 40, wherein $R_6$ is a $C_4$–$C_{12}$ acid-labile group.

42. The photosensitive polymer of claim 41, wherein $R_6$ is a t-butyl group.

43. The photosensitive polymer of claim 7 having a structural formula:

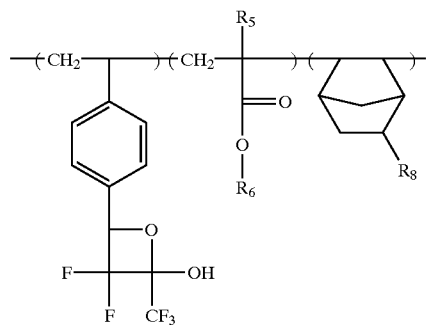

where $R_5$ is a hydrogen atom, a methyl group, or a trifluoromethyl group; $R_6$ is a hydrogen atom or a substituted or unsubstituted $C_1$–$C_{20}$ hydrocarbon group; and $R_8$ is a hydrogen atom, a hydroxyl group, a nitrile group, a substituted or unsubstituted $C_1$–$C_{12}$ alkyl group, a fluorinated $C_1$–$C_{12}$ alkyl group, an alkoxy group, or an ester group.

44. The photosensitive polymer of claim 43, wherein $R_6$ is a $C_4$–$C_{12}$ acid-labile group.

45. The photosensitive polymer of claim 44, wherein $R_6$ is a t-butyl group.

46. The photosensitive polymer of claim 43, wherein $R_8$ is a fluorinated $C_3$–$C_{10}$ alkyl alcohol group.

47. The photosensitive polymer of claim 43, wherein $R_8$ is a 2-hydroxyhexafluoroisopropyl group.

48. A resist composition comprising: the photosensitive polymer of any one of claims 1 through 47; and a photoacid generator (PAG).

49. The resist composition of claim 48, wherein the photoacid generator is contained in an amount of about 1–15% by weight based on the total weight of the photosensitive polymer.

50. The resist composition of claim 48, wherein the photoacid generator comprises triarylsulfonium salts, diaryliodonium salts, sulfonates, or a mixture of these compounds.

51. The resist composition of claim 48, wherein the photoacid generator comprises triphenylsulfonium triflate, triphenylsulfonium antimonate, diphenyliodonium triflate, diphenyliodonium antimonite, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium perfluorooctanesulfonate, methoxydiphenyliodonium perfluorooctanesulfonate, di-t-butyldiphenyliodonium triflate, N-hydroxysuccinimide perfluorooctanesulfonate, norbornene-dicarboximide perfluorooctanesulfonate, or a mixture of these compounds.

52. The resist composition of claim 48, further comprising an organic base.

53. The resist composition of claim 52, wherein the organic base is contained in an amount of about 0.01–2.0% by weight based on the total weight of the photosensitive polymer.

54. The resist composition of claim 52, wherein the organic base comprises a single tertiary amine compound or a mixture of at least two ternary amine compounds.

55. The resist composition of claim 52, wherein the organic base comprises triethylamine, triisobutylamine, triisooctylamine, triisodecylamine, diethanolamine, triethanolamine, or a mixture of these compounds.

56. The resist composition of claim 48, further comprising a surfactant of about 30–200 ppm.

57. The resist composition of claim 48, further comprising a dissolution inhibitor of about 0.1–50% by weight based on the total weight of the photosensitive polymer.

* * * * *